United States Patent [19]
Lee

[11] Patent Number: 5,208,775
[45] Date of Patent: May 4, 1993

[54] DUAL-PORT MEMORY DEVICE

[75] Inventor: Jang-Kyu Lee, Seoul, Rep. of Korea

[73] Assignee: Samsung Electronics Co., Ltd., Suweon, Rep. of Korea

[21] Appl. No.: 578,945

[22] Filed: Sep. 7, 1990

[51] Int. Cl.$^5$ .......................................... G11C 29/00
[52] U.S. Cl. ................................. 365/200; 365/221; 365/225.7; 365/230.03; 365/230.04; 365/230.05; 365/239; 371/10.2
[58] Field of Search ............ 365/200, 221, 239, 225.7, 365/230.02, 230.03, 230.04, 230.05; 371/10.2

[56] References Cited

U.S. PATENT DOCUMENTS

| | | | |
|---|---|---|---|
| 4,157,480 | 6/1979 | Edwards | 365/225.7 |
| 4,254,477 | 3/1981 | Hsia et al. | 365/200 |
| 4,660,179 | 4/1987 | Aoyama | 365/200 |
| 4,688,197 | 8/1987 | Novak et al. | 365/221 |
| 4,688,220 | 8/1987 | Pelgrom | 371/10.2 |
| 4,748,597 | 5/1988 | Saito et al. | 371/10.2 |
| 4,837,520 | 6/1989 | Golke et al. | 365/200 |
| 4,862,417 | 8/1989 | List et al. | 365/200 |
| 4,992,984 | 2/1991 | Busch et al. | 365/230.03 |
| 5,005,158 | 4/1991 | McClure et al. | 365/221 |
| 5,018,110 | 5/1991 | Sugiyama et al. | 365/221 |
| 5,025,418 | 6/1991 | Asoh | 371/10.2 |
| 5,058,071 | 10/1991 | Kohda et al. | 365/200 |
| 5,060,197 | 10/1991 | Park et al. | 371/10.2 |

Primary Examiner—Joseph E. Clawson, Jr.
Attorney, Agent, or Firm—Ladas & Parry

[57] ABSTRACT

If a defect is occurred in a certain normal memory when a dual-port memory device having a first and a second normal memory carries out the data transfer by a first and a second transfer signal, either of the first or the second transfer signals which corresponds to the defective normal memory is selected by a redundant transfer signal generator. The redundant transfer signal makes a redundant transfer gate turned on to transfer the data between a redundant RAM and a redundant SAM, and to substitute for the defective part of the normal memory. Thus, the defective part of the normal memory means which is occurred during the split transfer of data can be replaced by the single redundant circuit, so that the size of the memory device becomes minimize.

2 Claims, 2 Drawing Sheets

DUAL-PORT MEMORY DEVICE

BACKGROUND OF THE INVENTION

This invention relates to a dual-port memory device with RAM(Random Access Memory) and SAM(Serial Access Memory) ports, more particularly, a dual-port memory device also comprises a redundant circuit. The dual-port memory device has one or more RAM and SAM ports formed of memory cell array blocks, respectively. The dual-port memory device has been developed to be used as a VRAM(Video RAM) for graphic display.

In a conventional DRAM(Dynamic RAM), when a data is transferred from a processor to a peripheral device, the data is transferred to a memory and subsequently the peripheral device carries out the access of the transferred data. In that case, the processor can't transfer the data to the memory during the access is carried out by the peripheral device.

But, in the dual-port memory, the peripheral device carries out the access of the transferred data in the memory through a second port, while the data is transferred to the memory through a first port. The first and the second ports represent the RAM and the SAM ports, respectively. The SAM port has a fast access time so a VRAM is used for the high resolution and the high speed graphic display. In order to carry out the split transfer of this dual-port memory device, a normal memory means is divided into upper and lower parts.

When the lower part is a first normal memory and the upper part is a second normal memory, the SAM of the second normal memory carries out a read transfer operation RT or a write transfer operation WT while the SAM of the first normal memory carries out a read operation or a write operation. Further, the redundant circuit prevents the reduction of the production yield due to the defect of the normal memory means caused by integration. Therefore, if the defect is generated at a certain part of the normal memory means, the redundant circuit is connected instead of the defective normal memory means in order to maintain the normal operation.

In order to carry out the split transfer mode in the conventional dual-port memory device with the redundant circuit means, the normal memory means is divided into the first and the second memories, where the read or the write operation is carried out at one part while the RT or the WT operation is carried out at the other part. Thus, a first or a second transfer signal is required correspondingly to the first and the second normal memories for the split transfer of the normal memory means.

In that case, a first and second redundant circuit are also provided to the redundant memory means respectively in the same manner with the normal memory means, so that the first and the second redundant circuits of the redundant memory means are connected instead of the first and the second normal memories when the normal memory means have the defect, thereby the normal operation is maintained on.

There is, however, a disadvantage that the size of the memory device must be enlarged, since the redundant memory means should be provided with the first and the second redundant circuits respectively for the compensation of the defects of the first and the second normal memories in the split transfer mode.

SUMMARY OF THE INVENTION

This invention has an object to provide a dual-port memory device in which a single redundant circuit is provided to compensate the defect of the normal memory means formed of the first and the second normal memories.

According to this invention, there is provided a dual-port memory device comprising: a normal memory means including a RAM part having a first and a second RAM, a SAM part having a first and a second SAM, a gate part having a first and a second gate for memory transfer, and a generator for providing a first and second transfer signal to said first and second gates for memory transfer, so that the split transfer of data can be accomplished in such a manner that a first normal memory is transferred from the first RAM and the first SAM while a second normal memory is transferred from the second RAM and the second SAM; a redundant memory means including a redundant RAM, a redundant SAM, and a redundant transfer gate, so as to substitute for a certain defective part of one of said normal memories during the data transfer; and a redundant transfer signal generator for input the first and the second transfer signals from the generator of the memory transfer signal and selectively providing the transfer signal of the normal memory from a certain defective part to said redundant gate.

BRIEF DESCRIPTION OF THE DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

This invention will be now described in more detail with reference to the accompanying drawings.

Figure 1:
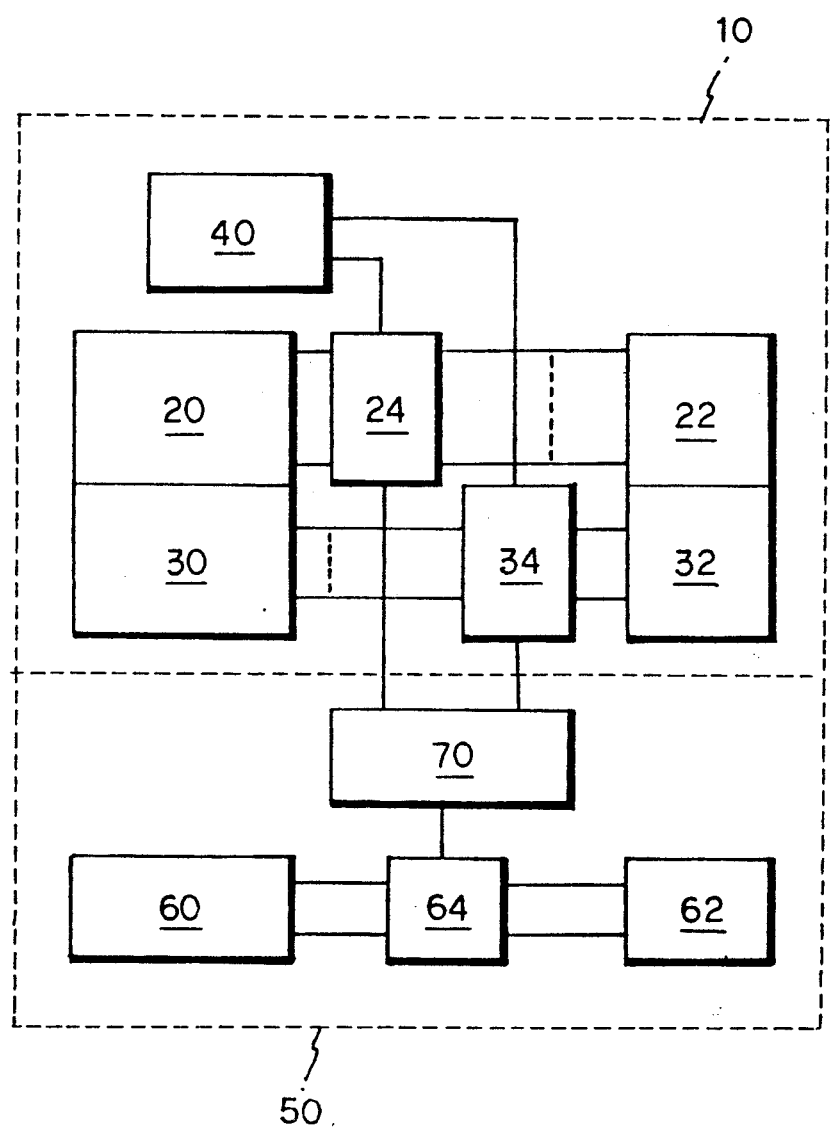
FIG. 1 is a block diagram of a dual-port memory device according to the present invention.

FIG. 1 shows the dual-port memory device according to the present invention. In FIG. 1, the dual-port memory device comprises at least one normal memory means 10 and a redundant memory means 50. The normal memory means 10 includes a RAM part having a first and second RAM 20 and 30, a SAM part having a first and second SAM 22 and 32, a first and a second memory transfer gate 24 and 34 respectively interposed between the first RAM and the first SAM and between the second RAM and the second SAM, and a memory transfer signal generator 40 for generating transfer signals and providing them to the first and the second memory transfer gates 22 and 32.

On the other hand, the redundant memory means 50 includes a redundant RAM 60, a redundant SAM 62, a redundant transfer gate 64 interposed between the redundant RAM 60 and the redundant SAM 62, and a redundant transfer signal generator 70 interposed between the redundant transfer gate 64 and the first and second memory transfer gates 24 and 34.

In operation, first, if the first normal memory is made from the first RAM 20 and the first SAM 22 and the second normal memory is made from the second RAM 30 and the second SAM 32, the first SAM 22 is in the access state if the MSB(Most Significant Bit) of an address is '0'(logic low), while the second SAM 32 is in the access state if the MSB of address is '1'(logic high) during the split transfer operation of the dual-port memory device.

When the first SAM 22 is in the access state, the data transfer is carried out in the second SAM 32. Contrary, if the second SAM 32 is in the access state, the data transfer is carried out in the first SAM 22. Also, the first and the second transfer signals generated from the memory transfer signal generator 40 are provided to the first and the second memory transfer gates 24 and 34, respectively.

In that case, the first and the second transfer signals are multiplexed with the MSB of the address and provided to the first and the second memory transfer gates 24 and 34. Thus, the first and the second transfer signals respectively multiplexed with the MSB of the address make the memory transfer gates 24 and 34 turned on and off, respectively.

For example, if the MSB of the address is '1', the first transfer signal is multiplexed, thereby to turn on the first memory transfer gate 24. Then, the first normal memory made from the first RAM 20 and the first SAM 22 carries out the RT mode or the WT mode, while the second normal memory made from the second RAM 30 and the second SAM 32 carries out the read mode or the write mode and the signals to be provided to the first and the second memory transfer gates 24 and 34 are provided to the redundant transfer signal generator 70.

In the redundant transfer signal generator 70, the first transfer signal to turn on the redundant transfer gate 64 is selected and provided. Then, the redundant memory means 50 made from the redundant RAM 60 and the redundant SAM 62 carries out the data transfer, thereby to substitute for the certain defective part of the first normal memory.

Figure 2:
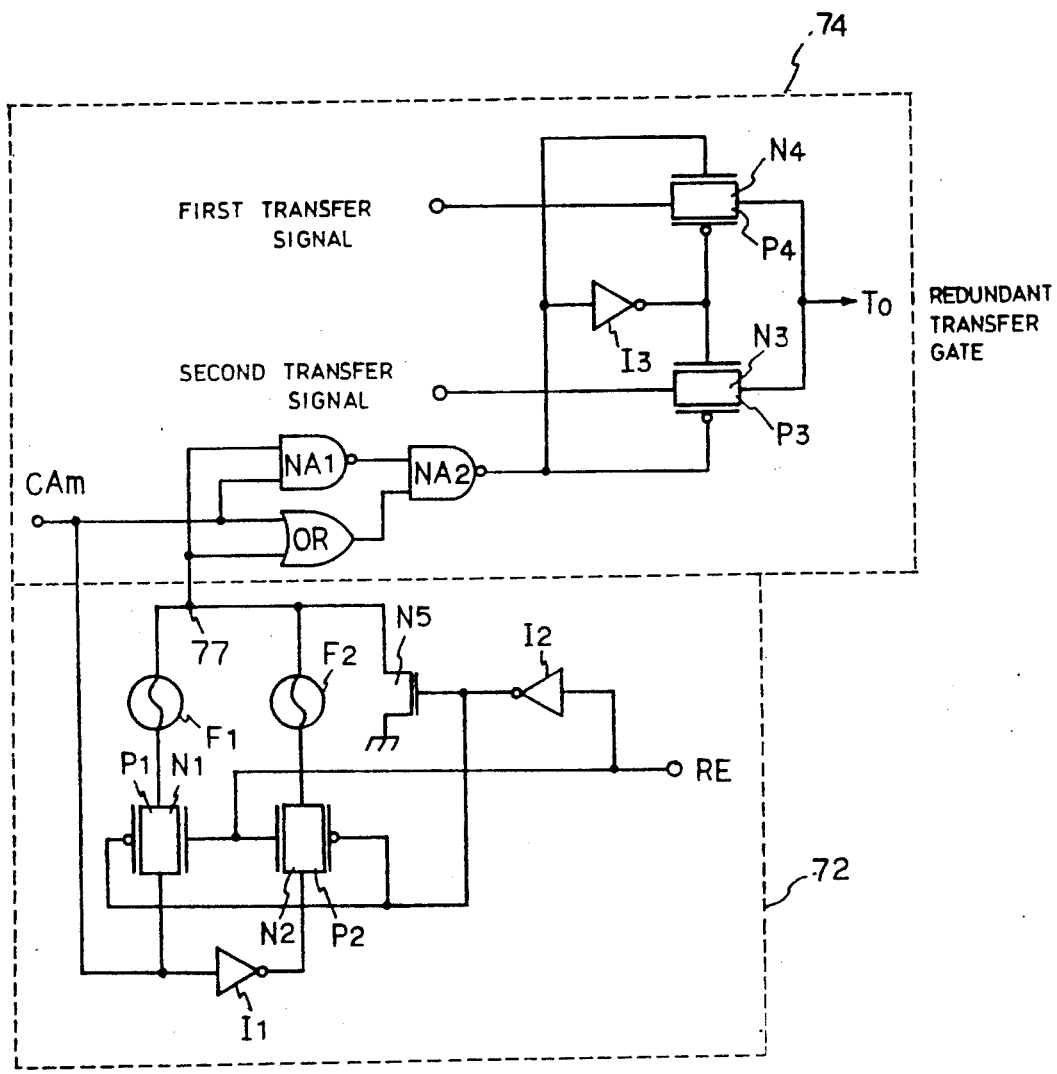
FIG. 2 is a detailed circuit diagram of the redundant transfer signal generator illustrated in FIG. 1 according to the present invention.

FIG. 2 is a detailed circuit diagram of the redundant transfer signal generator 70 as shown in FIG. 1 according to the present invention. In FIG. 2, the redundant transfer signal generator 70 is made from a fuse circuit 72 and a transfer signal selector circuit 74.

The fuse circuit 72 provides the MSB of a redundant address RCAm which is always '1' by the MSB of a fundamental address CAm which is enabled and applied by a redundant enable signal RE which is '1', when the defect is occurred at a certain part of the normal memory means 10.

The transfer signal selector circuit 74 selects either of the first and the second transfer signals as the redundant transfer signal by the MSB of the fundamental address CAm and the MSB of the redundant address RCAm.

Now, the operation of the redundant transfer signal generator 70 will be described. First, the first normal memory carries out the data transfer if the MSB of the fundamental address CAm is '1', while the data transfer is interrupted and the RE signal is changed into '1' if the defect is occurred.

Then, the RE signal of '1' is applied to each gate of two NMOS transistors N1 and N2 and the output of the RE signal of '0' inverted by an inverter I2 is applied to each gate of a NMOS transistor N5 and two PMOS transistors P1 and P2, where the NMOS transistor N5 is turned off while the other transistors N1, N2, P1 and P2 are turned on to establish an initial value.

Thus, the MSB of the fundamental address CAm provides the MSB of the redundant address RCAm to a node 77 through the transistors N1 and P1 and a first fuse F1, or through an inverter I1, the transistors N2 and P2, and a second fuse F2.

In that case, since the MSB of the redundant address RCAm must be always '1', the second fuse F2 is cut off and the MSB of the fundamental address CAm is transferred through the first fuse F1. The MSB of the redundant address RCAm of '1' is applied to each one input terminal of a NAND-gate NA1 and an OR-gate OR.

Also, the MSB of the fundamental address CAm of '1' is applied to each of the other input terminal of the NAND-gate NA1 and the OR gate OR. Thus, the NAND-gate NA1 and the OR-gate OR provide '0' and '1' respectively to input terminals of a NAND-gate NA2. The NAND-gate NA2 provides the output of '1' to each gate of a PMOS transistor P3 PMOS and a NMOS transistor N4.

Further, the output of the NAND-gate NA2 is inverted by an inverter I3 and this inverted output is applied to each gate of a PMOS transistor P4 and a NMOS transistor N3.

Thus, the transistor P4 and N4 are turned on to provide the first transfer signal to the redundant transfer gate 64. Then, the redundant transfer gate 64 is turned on so that the redundant RAM 60 and the redundant SAM 62 can accomplish the data transfer instead of the certain defective part of the first normal memory.

On the other hand, when the second normal memory carries out the data transfer, the MSB of the fundamental address CAm of '0' is applied. Thus, if the defect is occurred at a certain part of the second normal memory, the fuse F1 at the redundant transfer signal generator 70 is cut off. Then, the PMOS transistor P3 and the NMOS transistor N3 are turned on to provide the second transfer signal to the redundant transfer gate 64. The redundant transfer gate 64 is turned on so that the redundant RAM 60 and the redundant SAM 62 can accomplish the data transfer instead of the certain defective part of the second normal memory.

As mentioned hereinabove, in the dual-port memory device having the first and the second normal memories according to the present invention, if the defect is occurred at a certain normal memory either of the first or the second transfer signal which corresponds to the defective normal memory is selected by the redundant transfer signal generator. The transfer signal turns on the redundant transfer gate to carry out the data transfer between the redundant RAM and the redundant SAM and to substitute for the defective part of the normal memory. Thus, the present invention has an advantage in which a single redundant circuit is provided to substitute for the defective part of the normal memory means during the split transfer of data, so the dual-port memory device according to the present invention can be reduced in its size.

The invention is in no way limited to the embodiment described hereinabove. Various modifications of the disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A dual-port memory for split data transfer comprising:
   a first normal memory means comprising a first RAM (Random Access Memory), a first SAM (Serial Access Memory), and a first transfer gate connected for memory data transfer between said first RAM and said first SAM when said first transfer gate is turned on;

a second memory means comprising a second RAM, a second SAM, and a second transfer gate for memory data transfer between said second RAM and said second SAM when said second transfer gate is turned on;

a transfer memory signal generator for providing first and second transfer signals to said first and second transfer gates, respectively, for turning on said first transfer gate while turning off said second transfer gate, and vice-versa, in response to a preselected characteristic of a first address signal (CAm) applied to said memory; and a redundant memory comprising a redundant RAM, a redundant SAM, a redundant transfer gate connected for memory data transfer between said redundant RAM and said redundant SAM when said redundant transfer gate is turned on, and a redundant transfer signal generator for selecting one of said first and second transfer signals in response to said preselected characteristic of said first address signal and in response to a redundant enable signal (RE) indicative of the presence of a defect in one of said first and second memory means for turning on said redundant transfer gate and substituting said redundant memory for said one of said first and second normal memory means in which said defect occurs.

2. A dual port memory device according to claim 1 wherein said preselected characteristic of said address signal comprises the MSB (Most Significant Bit) of said first address signal, and wherein said redundant transfer signal generator comprises a fuse circuit generating a preselected logic value regardless of the MSB of a second address signal (RCAm) applied to said redundant memory, and said redundant signal selector selects one of said first and second transfer signals in response to said preselected logic value and said MSB of said first address signal.

* * * * *